United States Patent [19]
Young, Jr.

[11] 4,317,051
[45] Feb. 23, 1982

[54] CLOCK GENERATOR (BUFFER) CIRCUIT

[75] Inventor: Ernst H. Young, Jr., Center Valley, Pa.

[73] Assignee: Bell Telephone Laboratories, Incorporated, Murray Hill, N.J.

[21] Appl. No.: 82,583

[22] Filed: Oct. 9, 1979

[51] Int. Cl.³ .............................................. H03K 3/26
[52] U.S. Cl. .................. 307/246; 307/270; 307/578; 307/DIG. 4
[58] Field of Search .............. 307/482, 246, 574, 578, 307/270, DIG. 1, DIG. 4; 328/176

[56] References Cited

U.S. PATENT DOCUMENTS 4,061,933 12/1977 Schroeder et al. ............ 307/246 X
4,071,783 1/1978 Knepper .......................... 307/482 X

OTHER PUBLICATIONS

Cukier, *Push-Pull Circuit*, IBM Technical Disclosure Bulletin, vol. 18, No. 2, Jul. 1975, pp. 467, 468.

*Primary Examiner*—Eugene R. La Roche
*Attorney, Agent, or Firm*—Irwin Ostroff

[57] ABSTRACT

A clock generator (buffer) circuit, which consists of an inverter stage, three serially connected field effect transistors, a bootstrap capacitor, a delay element, and two totem pole stages, has good response time and is useful with many of today's static random access memories. The transistors used are enhancement and depletion mode insulated gate field effect transistors.

10 Claims, 1 Drawing Figure

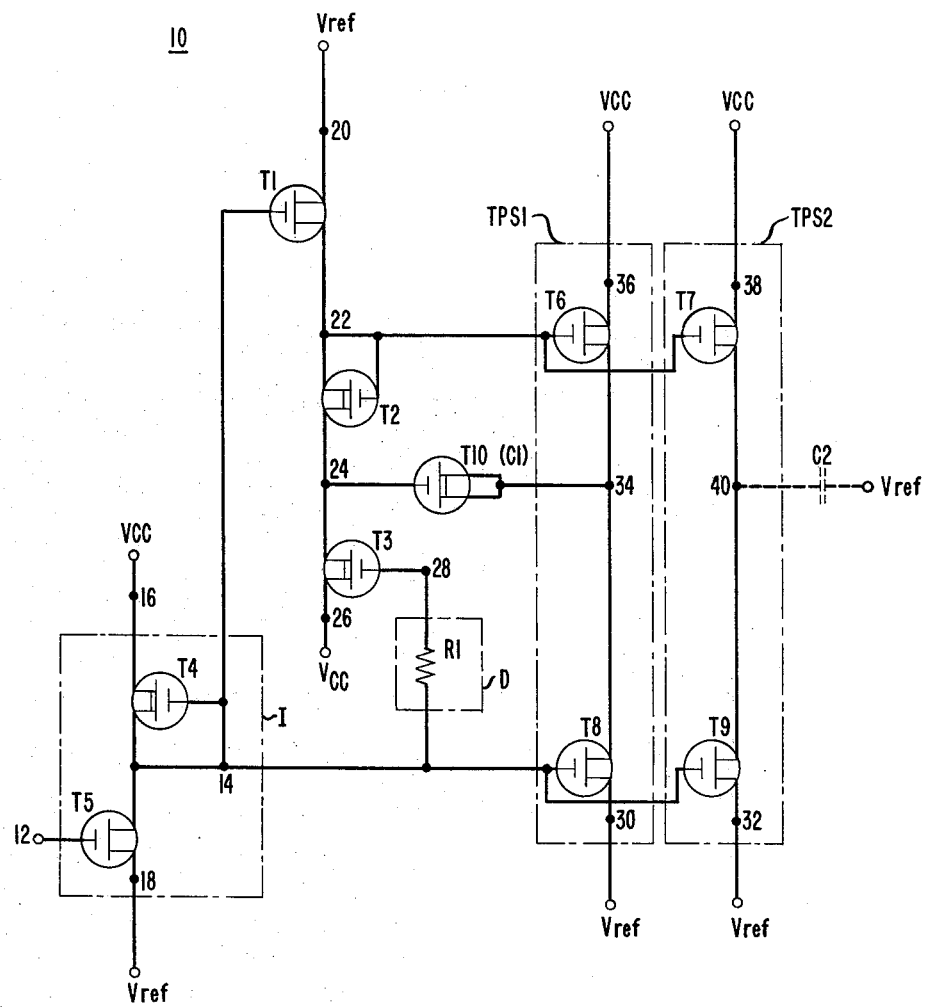

CLOCK GENERATOR (BUFFER) CIRCUIT

BACKGROUND OF THE INVENTION

This invention relates to buffer circuitry and, more particularly, to a clock generator (buffer) circuit useful as part of a random access memory.

The article entitled "Dynamic Depletion Mode: An E/D MOSFET Circuit Method" by R. W. Knepper, 1978 *IEEE International Solid-State Circuits Conference Digest of Technical Papers,* Vol. 21, pages 16 and 17 (FIG. 2), describes a driver (buffer) circuit which provides output signal levels which are the same as input signal levels and which uses enhancement and depletion mode field effect transistors. One problem with this circuit is that the response time is slower than is desirable in many applications. One reason for this is that the gate of depletion transistor T4 is connected to the input terminal. This causes terminal 2 (one of the bootstrap terminals) to rapidly discharge as the input signal switches from a low to a high level and thereby slows the response time of the circuit.

A circuit of complexity comparable to the circuit of the above-described publication, but with improved response time, is desirable.

SUMMARY OF THE INVENTION

The present invention is essentially a circuit which comprises an input inverter stage having an input terminal which serves as the circuit input terminal and an output terminal, serially coupled first, second, and third switching devices T1, T2, and T3, respectively, which each has a control terminal and first and second output terminals, a capacitor circuit means, and a totem pole stage having first and second input terminals and an output terminal. The second output terminal of T1 is coupled to the first output terminal of T2 and to the first input terminal of the totem pole stage. The output terminal of the inverter stage is coupled to the control terminals of the first and third devices. The second output terminal of T2 is coupled to the first output terminal of T3 and to the first terminal of the capacitor circuit means. The output terminal of the totem pole stage is coupled to the second terminal of the capacitor circuit means. The circuit is characterized in that the control terminal of the second device is coupled to the second output terminal of the first device.

In a preferred embodiment a second totem pole stage, which has a first input terminal coupled to the first input terminal of the first totem pole stage and has a second input terminal coupled to the second input terminal of the first totem pole stage, is used. The second totem pole stage has an output terminal which serves as the circuit output terminal. In this embodiment the output terminal of the input inverter stage is coupled through a delay element to the control terminal of T3 and each totem pole stage comprises two serially connected enhancement mode field effect transistors. T1 is an enhancement mode field effect transistor and T2 and T3 are depletion mode field effect transistors. The input inverter stage comprises a depletion mode field effect transistor with the gate and source terminals coupled to the source terminal of an enhancement mode field effect transistor whose gate terminal serves as the circuit input terminal. The drain terminal of the enhancement mode transistor of the input inverter stage serves as the output terminal of the input inverter stage.

The circuit of the present invention is electrically characterized in that the signal appearing at the output terminal of the first or second totem pole stage is the same logic state as appears at the input terminal. The capacitor circuit means acts as a bootstrap capacitor such that the output logic signal levels reach essentially the same levels as the power supplies used with the circuit.

These and other features and advantages of the invention will be better understood from consideration of the following detailed description when taken in conjunction with the accompanying drawing.

BRIEF DESCRIPTION OF THE DRAWING

The FIGURE illustrates a circuit in accordance with the present invention.

DETAILED DESCRIPTION

Referring now to the FIGURE, there is illustrated a circuit 10 which, in response to an input signal at an input terminal 12, provides an output signal at an output terminal 40 which has the same logic state as the input signal. Circuit 10 is designed to be capable of relatively high speed operation even with moderately high capacitive loading (illustrated as dashed line capacitor C2) connected to output terminal 40.

Circuit 10 comprises an inverter stage (illustrated within the dashed line rectangle denoted as I), first and second totem pole stages (illustrated within the dashed line rectangles TPS1 and TPS2, respectively), switching devices T1, T2, and T3, which each has a control terminal and first and second output terminals, a capacitor T10 (C1), which may be referred to as capacitor circuit means, and a delay element (illustrated within the dashed line rectangle D as a resistor R1).

In a preferred embodiment, inverter stage I comprises enhancement mode field effect transistor T5 and depletion mode field effect transistor T4. Input terminal 12 is connected to the gate of T5. The drain of T4 is coupled to a terminal 16 and to a power supply VCC. The source of T5 is connected to terminal 18 and to a voltage source Vref. The gate and the source of T4 and the drain of T5 are coupled to a terminal 14. TPS1 comprises serially connected enhancement mode field effect transistors T6 and T8 and TPS2 comprises serially connected enhancement mode field effect transistors T7 and T9. T1 is an enhancement mode field effect transistor and T2 and T3 are depletion mode field effect transistors. The delay element D is a resistor R1. Capacitor T10 (C1) comprises an enhancement mode field effect transistor with the gate serving as one terminal and the source and drain being connected together and serving as the second terminal.

The gates of T1, T8, and T9, and a first terminal of R1 are all connected to terminal 14. The source of T1 is connected to a terminal 20 and to Vref. The source of T8 is connected to a terminal 30 and to Vref. The source of T9 is connected to a terminal 32 and to Vref. The drain of T6 is connected to a terminal 36, and the drain of T7 is connected to a terminal 38. Terminals 36 and 38 are both connected to VCC.

The drain of T1, the gates of T2, T6, and T7, and source of T2 are all connected together to a terminal 22. The drain of T2, and the source of T3, and the gate of T10 (C1) are all connected to a terminal 24. The gate of T3 and a second terminal of R1 are connected together to terminal 28. The source of T6, the source and drain of T10 (C1), and the drain of T8 are all connected together to terminal 34. The source of T7 and the drain of T9 are connected together to circuit output terminal 40.

In one illustrative embodiment, circuit 10 is used as a clock pulse generator circuit with VCC=+5 V, Vref=0 V (ground potential), and the input logic high and low signal levels are +5 V and 0 V, respectively. Depletion-type transistors T2, T3, and T4 are designed to have a negative threshold voltage. The conductivity of these transistors is essentially greatest when the potential applied to the gate is the most positive.

A low input signal, a "0", applied to input terminal 12 causes T5 to be off. Since T4 is on, terminal 14 is at a potential of VCC. This causes T1, T8, and T9 to be on. T2 and T3, which are depletion mode transistors, are likewise on. With T1, T2, and T3 all being on, there exists a direct electrical path from VCC and terminal 26 through T1, T2, and T3 to terminal 20 and Vref. Accordingly, current flows from VCC into terminal 26 and through T3, T2, and T1 into terminal 20 and then into Vref. The electrical characteristics of T1, T2, and T3 are selected such that the terminal 22 assumes a potential within a few tenths of a volt of Vref and terminal 24 assumes a potential close to that of VCC.

The potential of terminal 22 (close to Vref) biases T6 and T7 off. The potential of terminal 14 (near VCC) biases T8 and T9 on and thus causes terminal 34 and output terminal 40 to be pulled to Vref (ground potential) and to be actively held there. This represents a "0" output signal at output terminal 40.

If now input terminal 12 is pulled to a high level, a "1", T5 is biased on and pulls the potential of terminal 14 to within a few tenths of a volt of Vref (ground potential). This is achieved because the electrical characteristics of T4 and T5 are selected so that when T4 and T5 are both conducting, the potential of terminal 14 closely follows that of the voltage applied to the source (terminal 18) of T5. This biases T1, T8, and T9 off. Terminals 34 and 40 are no longer being actively held at ground potential but are now electrically floating in potential at the previously set ground potential.

Terminal 22 now starts to rise in potential towards VCC since T1 is biased off. Because of the delay introduced by R1, T3 stays on and has relatively high conductivity after T1 has turned off. This acts to hold the potential terminal 24 close to VCC since a good deal of the charge necessary to charge up terminal 22 comes from VCC and not from capacitor T10 (C1).

As terminal 22 increases in potential, T6 and T7 being to be biased on and terminals 34 and 40 begin to rise in potential. The rise in potential of terminal 34 is capacitively bootstrapped through T10 (C1) to terminal 24 and then through T2 to terminal 22. This bootstrap effect causes terminal 22 to reach a potential of at least a threshold voltage above VCC. This allows a full VCC potential level to be transferred to output terminal 40. Output terminal 40 is now actively held at a potential of VCC by T7. The VCC potential level at output terminal 40 is considered a "1" output signal level.

If the input signal level applied to terminal 12 then drops back to the initial "0" level, T5 is biased off and terminal 14 returns to the VCC level and thus biases on T1, T8, and T9. This causes terminal 22 to drop in potential close to Vref (ground potential). This biases off T6 and T7 and allows biased on transistor T9 to actively pull output terminal 40 back to the "0" output level.

Transistors T7 and T9 serve to isolate the capacitive loading effect of C2 from terminal 34. This improves the response time of circuit 10. In some applications T7 and T9 can be eliminated and terminal 34 then serves as the output terminal.

The delay introduced by R1 serves to maintain T3 in a highly conductive state for a period of time after T1 is switched off in response to terminal 14 assuming a potential at or near ground potential. This serves to allow terminal 22, which was previously within a few tenths of a volt of ground potential, to rapidly rise in potential to approximately the value of VCC with most of the charge necessary to raise the potential of terminal 22 coming from VCC through the series combination of T3 and T2. Because terminal 24 discharges little and tends to remain at a potential close to VCC, the time necessary to switch circuit 10 is kept relatively low.

R1 can be eliminated and terminal 28 can be connected directly to terminal 14. This circuit modification would still result in a buffer circuit which was functional. However, it would tend to result in terminal 24 being discharged more than if the delay element is used. This results in a somewhat poorer response time than in the case in which the delay element is utilized.

The delay introduced by R1 also serves to keep T3 at a relatively low level of conduction for a period of time after T5 turns on in response to terminal 14 going from essentially ground potential to +VCC. This tends to maintain the potential of terminal 24 at the previous high level even though terminal 34 is dropping in potential towards Vref. The result is that the potential on terminal 24 is kept at a next higher level during this period of operation and thus circuitry 10 can be again switched and the repetition rate at which it can be used is increased.

Circuit 10 has been built as part of a 256 by 8 bit static random access memory that is formed on a single integrated silicon chip that has been tested and found to be functional. Circuit 10 was used to perform clock pulse generator functions and the threshold voltage (Vth), channel width, and channel length of each transistor utilized in one of the circuits are given in the table below. Each of the transistors is an insulated gate field effect transistor. T2, T3, and T4 are depletion mode transistors and T1, T5, T6, T7, T8, and T9 are enhancement mode transistors.

| Transistor | Threshold Voltage Vth (Volts) | Width (microns) | Length (microns) |
| --- | --- | --- | --- |
| T1 | +1.0 | 100 | 2.5 |
| T2 | −2.5 | 35 | 3.5 |
| T3 | −2.5 | 100 | 2.5 |
| T4 | −2.5 | 15 | 2.5 |
| T5 | +1.0 | 150 | 2.5 |
| T6 | +0.5 | 50 | 2.5 |
| T7 | +0.5 | 250 | 2.5 |
| T8 | +1.0 | 50 | 2.5 |
| T9 | +1.0 | 200 | 2.5 |

It is to be understood that the embodiments described herein are merely illustrative of the principles of the invention. Various modifications are possible within the scope of the invention. For example, the resistive delay element can be replaced by a number of other elements which produce the desired delay. Two inverter stages with the output of the first being connected to the input of the second could be used as the delay element. Still further, the input inverter stage can comprise two serially coupled enhancement mode transistors with the gate of one of the transistors serving as an input terminal and the gate of the other being coupled to its drain. Still further, the depletion mode transistors and bootstrap capacitor can be replaced by enhancement mode equivalent devices. Still further, the delay element can be eliminated and the gate of T3 is then connected directly to the output terminal of the input inverter stage.

I claim:

1. A circuit comprising:
    an inverter stage having a first terminal which serves as an input terminal of the circuit and a second terminal which serves as the output terminal of the inverter stage;
    capacitor circuit means having first and second terminals;
    first, second, and third switching devices T1, T2, and T3, respectively, which each has a control terminal and first and second output terminals;
    a totem pole stage having first and second input terminals and an output terminal;
    a delay element coupled to the output of the inverter stage and to the control terminal of T3;
    the output terminal of the inverter stage being coupled to the control terminal of T1, and to the second input terminal of the totem pole stage;
    the second output terminal of T1 being coupled to the first input terminal of the totem pole stage and to the first input terminal and the control terminal of T2;
    the second output terminal of T2 being coupled to the first terminal of the capacitor circuit means and to the first output terminal of T3; and
    the output terminal of the totem pole stage being coupled to the second terminal of the capacitor circuit means.

2. The circuitry of claim 1 further comprising a second totem pole stage which has a first input terminal coupled to the first input terminal of the first totem pole stage and which has a second input terminal coupled to the second input terminal of the first totem pole stage.

3. The circuitry of claim 2 wherein:
    the input inverter stage comprises a fourth transistor which is a depletion mode transistor and a fifth transistor which is an enhancement mode transistor;
    the first and second totem pole stages each comprises two serially connected enhancement mode field effect transistors;
    the first switching device is an enhancement mode field effect transistor and the second and third switching devices are depletion mode field effect transistors; and
    the delay element is a resistive type circuit element.

4. A circuit comprising:
    an inverter stage having a first terminal which serves as an input terminal of the circuit and a second terminal which serves as the output terminal of the inverter stage;
    capacitor circuit means having first and second terminals;
    first, second, third, fourth, and fifth switching devices T1, T2, T3, T6, and T8, respectively, which each has a control terminal and first and second output terminals;
    a delay element being connected to the output of the inverter stage and to the control terminal of T3;
    the output terminal of the inverter stage being coupled to the control terminals of T1 and T8;
    the second output terminal of T1 being coupled to the control terminals of T2 and T6 and to the first output terminal of T2;
    the second output terminal of T2 being coupled to the first terminal of the capacitor circuit means and to the first output terminal of T3; and
    the second output terminal of T6 being coupled to the first output terminal of T8, the second terminal of the capacitor circuit means and to a first output terminal of the circuit.

5. The circuit of claim 4 wherein the delay element comprises a resistor.

6. The circuit of claim 5 wherein each of the switching devices comprises a separate field effect transistor.

7. The circuit of claim 6 wherein the capacitor circuit means is a sixth field effect transistor T10 (C1) with the gate being connected to the first terminal and the drain and source being connected to the second terminal.

8. The circuit of claim 7 further comprising seventh and eighth field effect transistors T7 and T9, respectively, with the gate of T7 being coupled to the gate of T6 and the gate of T9 being connected to the gate of T8, and with the source of T7 being coupled to the drain of T9 and to a second output terminal.

9. The circuit of claim 8 wherein the inverter stage comprises tenth and eleventh field effect transistors T4 and T5, respectively, with the gate of T5 being coupled to the circuit input terminal and with the gate and drain of T4 and the drain of T5 being coupled to the output terminal of the inverter stage.

10. The circuit of claim 9 wherein T1, T5, T6, T7, T8, and T9 are enhancement mode transistors and T2, T3, T4, and T10 (C1) are depletion mode field effect transistors.

* * * * *